United States Patent
Romanowski

(10) Patent No.: US 7,579,569 B2
(45) Date of Patent: Aug. 25, 2009

(54) CAPACITIVE PROXIMITY AND/OR TOUCH-SENSITIVE SWITCH

(75) Inventor: Hans-Jürgen Romanowski, Bernhardswald (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 17 days.

(21) Appl. No.: 11/664,204

(22) PCT Filed: Sep. 23, 2005

(86) PCT No.: PCT/EP2005/054768

§ 371 (c)(1),
(2), (4) Date: May 11, 2007

(87) PCT Pub. No.: WO2006/034993

PCT Pub. Date: Apr. 6, 2006

(65) Prior Publication Data

US 2008/0099322 A1 May 1, 2008

(30) Foreign Application Priority Data

Sep. 29, 2004 (DE) .................. 10 2004 047 381
Feb. 25, 2005 (DE) .................. 10 2005 008 758

(51) Int. Cl.
*H03K 17/975* (2006.01)
(52) U.S. Cl. ..................................... 200/600
(58) Field of Classification Search .................. 200/600
See application file for complete search history.

(56) References Cited

U.S. PATENT DOCUMENTS

| | | | |
|---|---|---|---|
| 4,458,293 A * | 7/1984 | Cherry | ................ 341/33 |
| 4,482,932 A | 11/1984 | Hasegawa | |
| 5,892,652 A | 4/1999 | Bony et al. | |
| 5,917,165 A | 6/1999 | Platt et al. | |
| 5,973,417 A | 10/1999 | Goetz et al. | |
| 6,239,393 B1 | 5/2001 | Hansen | |
| 6,590,176 B2 * | 7/2003 | Cole et al. | ................ 200/341 |
| 6,742,911 B1 * | 6/2004 | Chen | .................. 362/206 |
| 6,982,630 B2 * | 1/2006 | Beckwith et al. | ........ 340/407.1 |
| 7,158,155 B2 * | 1/2007 | Ueda et al. | .................. 345/690 |
| 7,332,688 B2 * | 2/2008 | Browne et al. | ............ 200/512 |
| 2005/0023119 A1 * | 2/2005 | Lu | .......................... 200/276 |
| 2005/0179673 A1 | 8/2005 | Philipp | |

FOREIGN PATENT DOCUMENTS

| | | |
|---|---|---|
| DE | 2806320 A1 | 8/1979 |
| DE | 29721213 U1 | 3/1998 |
| DE | 69419735 T2 | 3/2000 |

(Continued)

*Primary Examiner*—Elvin G Enad
*Assistant Examiner*—Lheiren Mae A Anglo
(74) *Attorney, Agent, or Firm*—Laurence A. Greenberg; Werner H. Stemer; Ralph E. Locher

(57) ABSTRACT

A capacitive and/or touch-sensitive switch has an electroconductive body which is disposed between an electrically insulating covering plate and a carrier plate disposed at a distance from the covering plate, and can be elastically deformed in the spacing direction. The electroconductive body is applied to the lower side of the covering plate with the upper end thereof, defining a sensor surface, and to an electroconductive contact of the carrier plate with the lower end thereof. The electroconductive body is a pressure spring wound out of an elongated body.

16 Claims, 4 Drawing Sheets

FOREIGN PATENT DOCUMENTS

| | | |
|---|---|---|
| DE | 69800400 T2 | 3/2001 |
| DE | 697 02 958 T2 | 5/2001 |
| DE | 20119700 U1 | 3/2002 |
| DE | 20 2005 002 157 U1 | 5/2005 |
| EP | 0 070 984 A2 | 2/1983 |
| EP | 0688102 B1 | 12/1995 |
| EP | 0 858 166 A1 | 8/1998 |
| EP | 0 859 467 A1 | 8/1998 |
| GB | 2018023 A | 10/1979 |
| GB | 2317432 A | 3/1998 |
| WO | 0145213 A1 | 6/2001 |

* cited by examiner

CAPACITIVE PROXIMITY AND/OR TOUCH-SENSITIVE SWITCH

BACKGROUND OF THE INVENTION

Field of the Invention

The invention relates to a capacitive proximity and/or touch-sensitive switch with an electroconductive body which is arranged between an electrically insulating covering plate and a carrier plate arranged at a distance from said covering plate, and can be elastically deformed in the spacing direction. The electroconductive body is applied to the lower side of the covering plate with the upper end thereof, defining a sensor surface, and to an electroconductive contact of the carrier plate with the lower end thereof.

Such a capacitive proximity or touch-sensitive switch is already disclosed in U.S. Pat. No. 5,892,652 A. There a leaf spring is provided as the electroconductive body and is bent in a Z-shape. This leaf spring consists of a base plate, which is fastened to the carrier plate, and an upper plate, which can be pushed against the lower side of the covering plate arranged parallel to the carrier plate, and there forms the sensor surface. The base plate and the upper plate form the two ends of the Z, which are connected to each other by a central, oblique part of the Z. This oblique part provides the leaf spring with such flexibility that deviations in the parallelism between the carrier plate and the covering plate can be compensated for by the leaf spring. However, such a leaf spring has the disadvantage that in the absence of surface parallelism between the covering plate and the upper plate of the leaf spring, air cavities are formed between the upper plate and the lower side of the covering plate, thereby reducing the reaction sensitivity of the touch-sensitive switch on touching the upper side of the covering plate. A further disadvantage lies in the fact that if the distance between the covering and carrier plates varies, in addition to the distance between the upper plate and the base plate, their lateral position relative to each other also varies so that if the base plate is fixed on the carrier plate, the position of the sensor surface on the lower side of the covering plate varies according to the distance between the covering plate and the carrier plate.

SUMMARY OF THE INVENTION

The object of this invention is therefore to make available an improved capacitive proximity and/or touch-sensitive switch.

According to the invention the object indicated above is achieved in a capacitive proximity and/or touch-sensitive switch of the type already mentioned in that the electroconductive body is a pressure spring wound out of an elongated body.

The advantage of the invention is that different distances between the covering plate and the carrier plate can be bridged with the wound pressure spring without laterally displacing the position of the sensor surface on the lower side of the covering plate. Furthermore, in addition to deviations in the parallelism between the carrier plate and the covering plate, irregularities of the lower side of the covering plate and curvatures of the covering plate can be compensated for simply and easily. The elongated body is preferably a spring wire with a round or rectangular cross-section, from which the pressure spring can easily be wound.

The pressure spring has an upper end and a lower end opposite the upper end, the upper end being arranged on the covering plate and the lower end on the carrier plate. The pressure spring is suitably provided on its upper end with at least one upper turn bearing against the lower side of the covering plate, which turn forms the sensor surface. In particular, the upper turn has direct mechanical contact, at at least three points, with the lower side of the covering plate. Different shapes of the sensor surface may therefore be formed very easily by shaping the upper turn.

The pressure spring is preferably provided on at least one of its ends with at least two turns which lie in one plane in spiral fashion. Here it is irrelevant whether the turns are wound from the inside to the outside or from the outside to the inside. Because of this turns lying spirally one inside the other, a turn plate is formed on the upper end of the pressure spring and bears against the lower side of the covering plate. This turn plate is intrinsically elastic so that irregularities of the lower side of the covering plate inside the surface of the turn plate can be compensated for without effort. Because of the turns lying spirally one inside the other on the lower end of the pressure spring, a stable support for the pressure spring on the carrier plate is guaranteed, enabling the pressure spring to be easily aligned perpendicularly to the carrier plate during a loading process.

According to a preferred embodiment the pressure spring between the covering plate and the carrier plate is under compressive strain and the pressure spring is shaped on its upper end so that it is positively adapted to the lower side of the covering plate. Due to the compressive strain the upper turn of the pressure spring in particular is pressed against the lower side of the covering plate so that a positive contact can be established. If a turn plate is formed on the upper end of the pressure spring by a plurality of turns lying spirally in one plane, this turn plate is able to adapt the shape of the pressure spring under compressive strain to the shape of the lower side of the covering plate so that the upper turns bear positively against the lower side of the covering plate. In the case of convex covering plates this also optimum contact to be easily established between the sensor surface formed by the turn plate and the lower side of the covering plate.

The pressure spring is suitably cone-shaped in at least one upper and/or lower partial region so that the pressure spring has turns with different turn diameters. The advantage of this is that under compressive strain a plurality of turns comes to lie spirally in one plane and a turn plate is only formed in this manner when the pressure spring is under compressive strain. Therefore it is not necessary to design the pressure spring with a turn plate from the start, particularly on its upper end, but the turn plate is formed automatically as soon as the pressure spring is mounted under compressive strain between the covering plate and the carrier plate.

According to a preferred embodiment an axial distance exists in the upper partial region and/or the lower partial region between at least two adjacent turns in the direction of the axial spring elongation which, in the range between zero and a cross-sectional surface dimension of the elongated body, lies in the direction of the axial spring extension, and a radial distance exists in the direction of the radial spring extension which, in the range between one and one and a half times the cross-sectional dimension of the elongated body, lies in the direction of the radial spring extension. This defines the distance between the central cores of the turns, e.g. the central axes of the elongated body. Because of these closely spaced turns, which are arranged in particular on the upper and lower ends of the pressure springs, the interlocking of a plurality of pressure springs of the same time during an automated process of loading the carrier plates is prevented or reduced since the distance between two turns is shorter than the corresponding dimension of the elongated body.

The pressure spring is suitably cylinder shaped in at least one partial region, thus avoiding buckling of the pressure spring in this partial region as soon as the pressure spring is put under pressure when mounted between the carrier plate and the covering plate.

The cylindrical partial region is preferably provided, at least on one of its ends, with a lower partial region in which an axial distance exists between at least two turns lying one upon the other in the direction of the axial spring extension, which is shorter than two cross-sectional surface dimensions of the elongated body in the direction of the axial spring extension. Here too the distance between the central cores of two adjacent turns is defined. Because of these closely spaced turns a guide cylinder can be formed for a loading tool so that automatic loading of the carrier plate with one or a plurality of pressure springs is possible.

In particular, the lower partial region is arranged on one end of the cylindrical partial section to which a region with a smaller turn diameter connects, or which is itself an end section of the pressure spring. Because of these closely spaced turns interlocking of a plurality of pressure springs of the same type in an automated process of loading the carrier plates is prevented or reduced since the distance between two turns is shorter than the corresponding dimension of the elongated body.

According to a preferred embodiment the pressure spring is shaped cylindrically in a first partial region and in a second partial region, so that the first partial region has a turn diameter that is different from that of the second partial region, and so that a cone-shaped transition region is arranged between the first partial region and the second partial region. Under maximum pressure loading of the pressure spring the two partial regions may be displaced one inside the other so that the partial region with the smaller turn diameter comes to rest with at least one part of its axial extension inside the partial region with the larger turn diameter. The spring path of the pressure spring thereby achieved is extended relative to a spring path defined by uniform mutual contact of the turns, so that the range of distances between the carrier plate and the covering plate in which the pressure spring can be used is correspondingly enlarged. As a result of this fewer different types of pressure spring need be produced and kept in stock when manufacturing proximity and/or touch-sensitive switches according to the invention, thereby reducing the production costs.

The pressure spring preferably has on its lower end a position and/or twisting protection device which is formed, in particular, by a shaped soldering terminal and/or a shaped soldering pin. This enables the pressure spring to be easily soldered with its lower end to the electroconductive contact of the carrier plate.

The pressure spring preferably has on its lower end at least one lower turn bearing against the carrier plate. The pressure spring is connected galvanically to the electroconductive contact at at least three points, particularly with its lower turn. The advantage of this is that the pressure spring is able to adopt a stable position on the carrier plate for a soldering process. On the one hand this enables a mechanical stress-free soldered joint to be easily obtained, and on the other the lower turn can be soldered to the carrier plate in the form of an SMD soldered joint. It is therefore possible to automate the loading of the carrier plate with one or a plurality of pressure springs of this design. In particular, the pressure spring has on its lower end at least two turns which lie spirally in one plane. Because of an increasing number of such turns the wetting surface of the pressure spring, which is wetted with soldering paste in the soldering process, is enlarged so that the stability of the pressure spring on the carrier plate is increased in the soldering process.

In a preferred embodiment a lighting element, e.g. an LED, a bulb or a light conductor, is arranged on the carrier plate inside a region defined by the sensor surface, in particular inside the pressure spring. This lighting element may serve to identify the sensor surface or to signal different switching conditions of the proximity and/or touch-sensitive switch.

The invention is explained in greater detail in the following with reference to drawings, in which

DESCRIPTION OF THE PREFERRED EMBODIMENTS

Figure 1:
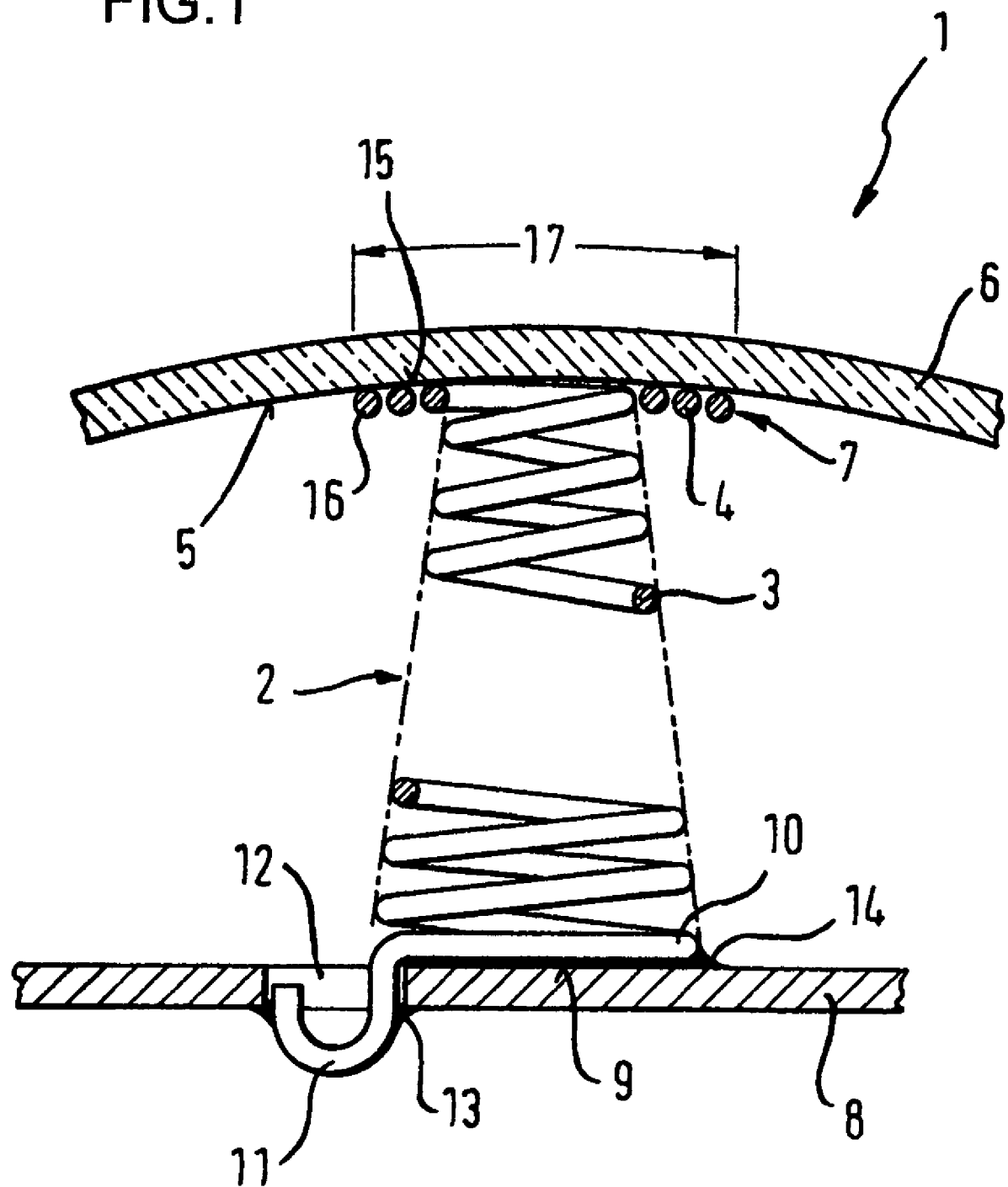
FIG. 1 shows in a diagrammatic sectional view a capacitive proximity and/or touch-sensitive switch according to the invention.

Before describing the drawings in detail it should be pointed out that corresponding or identical elements or component parts, in the various embodiments of the capacitive proximity and/or touch-sensitive switch according to the invention, are identified by the same reference numbers in all the figures in the drawings.

FIG. 1 shows, in a diagrammatic sectional view, a proximity and/or touch-sensitive switch according to the invention. As an electroconductive body, switch 1 contains a wound pressure spring 2, which is preferably formed from spring wire. This spring wire preferably has a round cross-section 3, but other cross-sectional shapes are also possible here for example an oval or polygon. Pressure spring 2 has on its upper end a plurality of turns 4, which bear positively and under compressive strain against a lower side 5 of a convex electrically insulating covering plate 6. These turns lie spirally one inside the other, thereby forming a flat turn plate 7, which is adapted elastically under spring tension to the convexity of covering plate 6. Covering plate 6 may consist of a dielectric such as glass, glass ceramic or plastic. A carrier plate 8 with an electroconductive contact surface 9, facing lower side 5 of covering plate 6, is arranged at a distance from covering plate 6. Carrier plate 8 may be a plastic plate which, on at least one of its plate sides, has said contact surface 9 and, if necessary, conductor paths via which contact surface 9 is electrically connected to an evaluation circuit (not shown). Pressure spring 2 has on its lower end a lower turn 10 with which it bears flatly against contact surface 9 of carrier plate 8. A soldering terminal 11, which projects through a hole 12 in carrier plate 8, is formed as a position and/or twisting protection device on the lower end of pressure spring 2. Soldering terminal 11 is connected by a swell soldered joint 13 and lower turn 10 is connected by an SMD soldered joint 14 to carrier plate 8. Pressure spring 2 is designed in the shape of a truncated cone between lower turn 10 and turn plate 7, the turn diameter decreasing from lower turn 10 to turn plate 7.

A sensor surface 15 is defined by upper turns 4 of turn plate 7 bearing against lower side 5 of the covering plate, which sensor surface is limited by an outer turn 16 of upper turns 4. In particular, outer turn 16 bears fully against lower side 5 of covering plate 6. Now if an element, such as a finger, which carries a potential that differs from the potential of contact surface 9 of carrier plate 8, particularly an earth potential, is brought closer to and/or into contact with a surface region 17 of covering plate 6 opposing sensor surface 15, the capacitance of a capacitor consisting of the element or finger concerned, the covering plate and sensor surface 15, is changed thereby. Since sensor surface 15 is connected electroconductively to contact surface 9 of carrier plate 8 and the latter is connected in turn to the evaluation circuit, the variation in capacitance is established and evaluated by the evaluation circuit. Furthermore, a light source (not shown), such as an LED, may be provided on carrier plate 8 in the region inside pressure spring 2, in order to identify sensor surface 15 or signal different switching conditions of switch 1. In addition, an electroconductive coat can be applied (not shown) to the surface of covering plate 6 in order to provide a uniform potential distribution in surface region 17 opposing sensor surface 15 on contact or approximation. In particular, this electroconductive coat, whose shape may vary according to sensor surface 15, may also extend beyond surface region 17, so that the region in which the proximity or touch-sensitive switch can be actuated, is enlarged. This electroconductive coat may in turn be coated with a dielectric protective coat (not shown) to prevent damage to the electroconductive coat and/or identify the position of the proximity and/or touch-sensitive switch.

Figure 2:
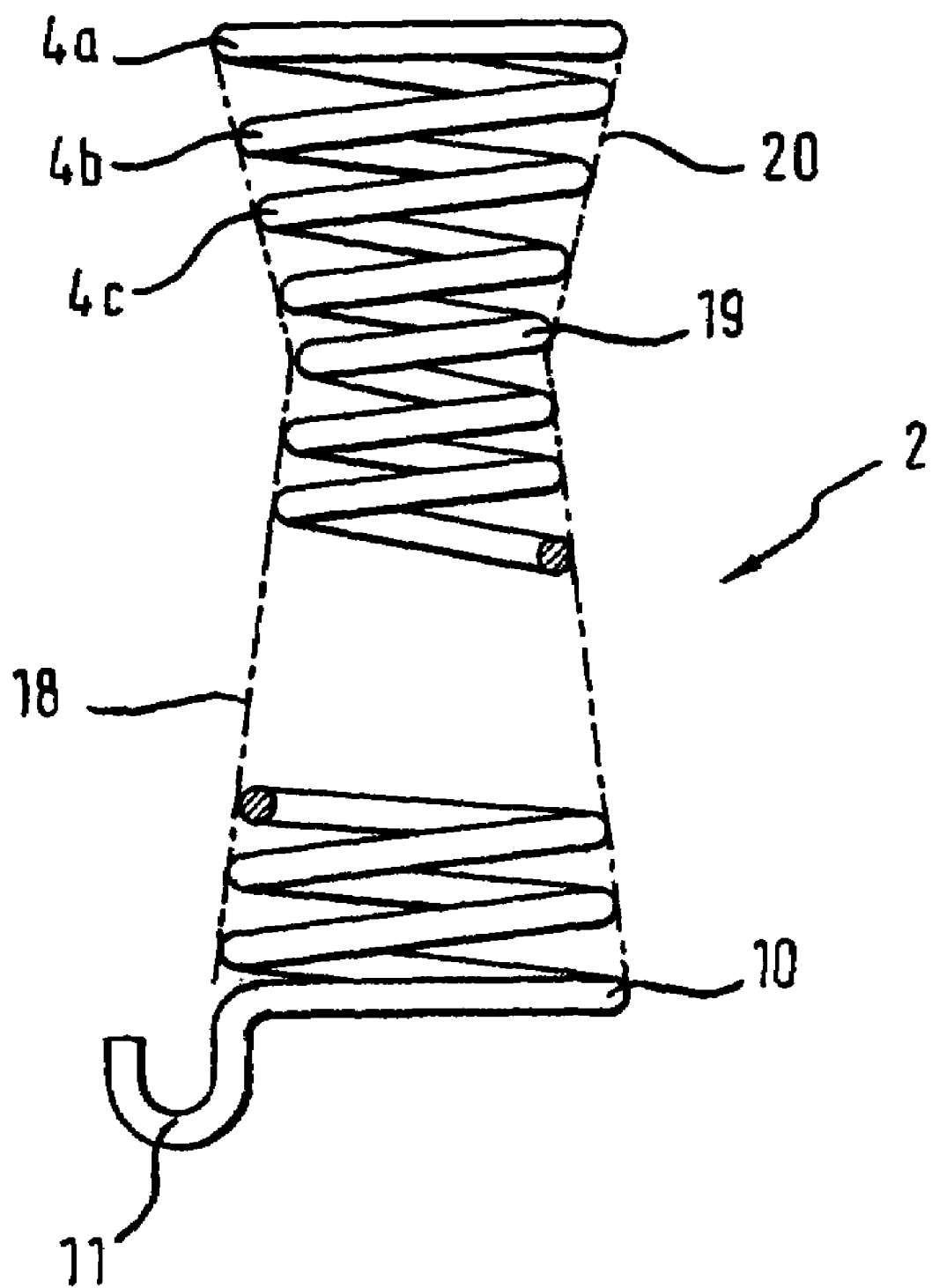
FIG. 2 shows in a diagrammatic side view a first embodiment of a pressure spring according to the invention.

FIG. 2 shows a diagrammatic side view of a first embodiment of pressure spring 2 according to the invention. The helically wound pressure spring 2 has a lower partial region 18 in the form of a truncated cone in which the turn diameter decreases from lower turn 10 upwards to a limiting turn 19 decreases. An upper partial region 20 is also connected to it in the form of a truncated cone, but now the turn diameter increases again from limiting turn 19 to uppermost turn 4a. If pressure spring 2 is mounted under compressive strain between covering plate 6 and carrier plate 8 according to FIG. 1, upper partial region 20 is upset in such a manner that uppermost turns 4a, 4b and 4c slide spirally inside one another. Turn plate 7, according to FIG. 1, is formed in this manner and upper turns 4a, 4b and 4c bear positively against lower side 5 of the covering plate. Alternatively, however, it is then also possible to shape turn plate 7 directly on limiting turn 19 when pressure spring 2 is not yet under compressive strain.

Figure 3:
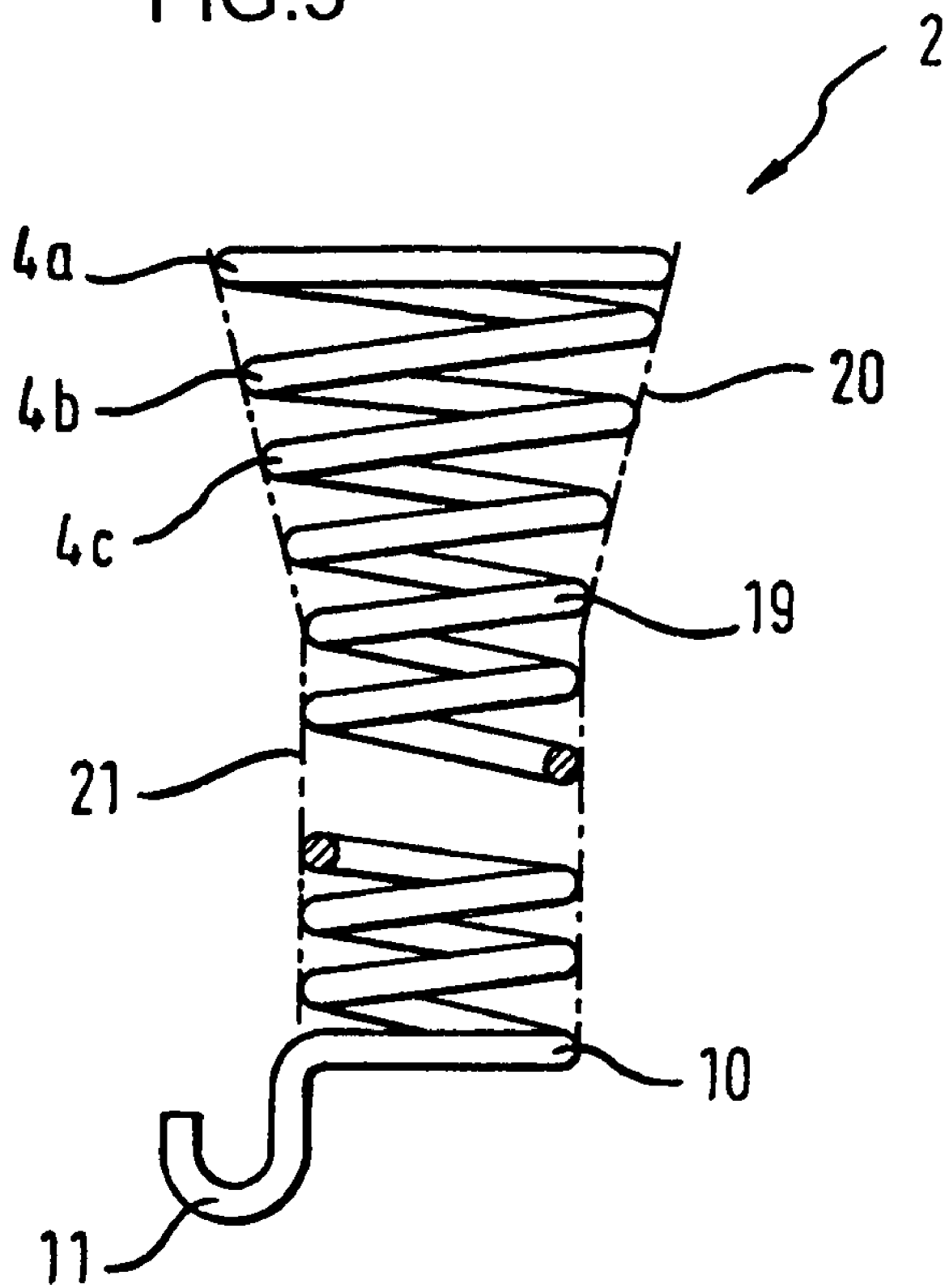
FIG. 3 shows in a diagrammatic side view a second embodiment of the pressure spring according to the invention.

FIG. 3 shows a diagrammatic side view of a second embodiment of pressure spring 2 according to the invention. In this case the helically wound pressure spring 2 has a lower partial region 21 in the form of a cylinder, where the turn diameter remains the same from lower turn 10 to limiting turn 19. Upper partial region 20 connects to it in the form of a truncated cone, but now the turn diameter increases from limiting turn 19 to uppermost turn 4a, so that when pressure spring 2 is mounted under compressive strain between covering plate 6 and carrier plate 8, turn plate 7 can again be formed.

Figure 4:
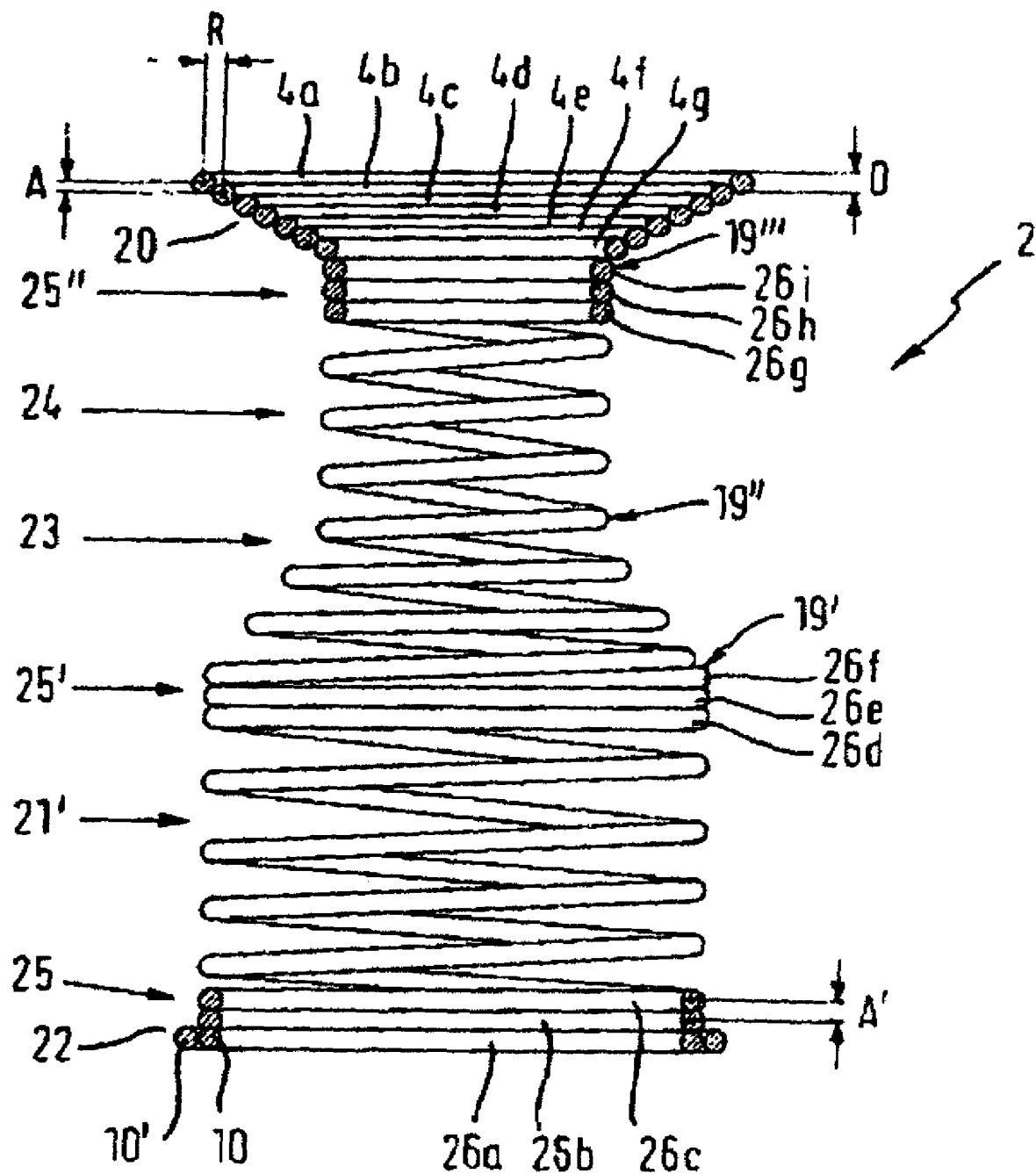
FIG. 4 shows in a diagrammatic side view a third embodiment of a pressure spring according to the invention.

FIG. 4 shows a diagrammatic side view of a third embodiment of pressure spring 2 according to the invention. In this case the helically wound pressure spring 2 has on its lower end 22 two lower turns 10, 10' which lie spirally in one plane, thereby guaranteeing a stable support for pressure spring 2 on carrier plate 8. These lower turns 10, 10' are wetted with soldering paste during the soldering process and are soldered to the carrier plate, which may, in particular, be a circuit board, in the form of an SMD-soldered joint. Departing from lower turn 10, pressure spring 2, as shown in FIG. 3, has a first partial region 21' in the shape of a cylinder, where the turn diameter remains the same from lower turn 10 to a first limiting turn 19'. This is followed by a transition region 23 in the shape of a truncated cone, but now the turn diameter from limiting turn 19' to a second limiting turn 19" decreases. A second partial region 24, in the shape of a cylinder, is connected to limiting turn 19", the turn diameter from second limiting turn 19" to a third limiting turn 19''' remaining the same. The turn diameter of second partial region 24 is therefore smaller than the turn diameter of first partial region 21'. As shown in FIG. 2, upper partial region 20 is connected to second partial region 24 in the shape of a truncated cone, the turn diameter from limiting turn 19''' to uppermost turn 4a again increasing, and pressure spring 2 under pressure forming turn plate 7.

Turns 4a to 4g of the upper partial region are closely wound in such a manner that an axial distance A, in the direction of the axial spring extension of half spring wire diameter D exists between two adjacent turns, and a radial distance R exists in the direction of the radial spring extension of one whole spring wire diameter D. Here the distance between two turns is measured from their centres. When pressure spring 2 is under compressive strain, a closed turn plate 7 is therefore formed, where adjacent turns of turns 4a to 4g contact each other. First cylindrical partial region 21' has, on its lower end, a first lower partial region 25 with three turns 26a, 26b and 26c, and on its upper end it has a second lower partial region 25' with three turns 26d, 26e and 26f, which are closely wound in such a manner that an axial distance A' exists between two adjacent turns in the direction of the axial spring extension of one spring wire diameter D, i.e. adjacent turns 26a and 26b, 26b and 26c, 26d and 26e, 26e and 26f touch each other so that in lower partial regions 25 and 25' pressure spring 2 has no spring action. Because of these closely spaced turns 4a to 4g, 26a to 26c and 26d to 26f, interlocking of pressure springs 2 of the same type is prevented during an automated loading process since the distance between two adjacent turns of turns 4a to 4g, 26a to 26c and 26d to 26f is shorter than spring wire diameter D.

The second cylindrical partial region 24 has on its upper end a third lower partial region 25" with three turns 26g, 26h and 26i, which are also closely wound in such a manner that an axial distance A' exists between two adjacent turns in the direction of the axial spring extension of one spring wire diameter D, i.e. adjacent turns 26g and 26h and 26h and 26i touch each other so that in the third lower partial region 25" pressure spring 2 has no spring action. Because of these closely spaced turns 26g to 26i, a guide cylinder is formed for a loading tool so that automatic loading of the carrier plate with one or a plurality of pressure springs 2 is possible.

Pressure spring 2 is generally wound in one piece from metallic spring wire. However, it is also possible to produce pressure spring 2 from other electroconductive materials such as electroconductive plastic or plastic with a metal core, in the form of a plastic moulding. Pressure spring 2 preferably has circular turns, but various other shapes are also possible, for example ovals, ellipses or polygons.

LIST OF REFERENCE SYMBOLS

1. Proximity and/or touch-sensitive switch
2. Wound pressure spring
3. Cross-section of the spring wire
4. Upper turns of the pressure spring
5. Lower side of the covering plate
6. Covering plate
7. Turn plate
8. Carrier plate 9. Electroconductive contact surface
10. Lower turn
11. Soldering terminal
12. Hole in the carrier plate
13. Swelling soldered joint
14. SMD soldered joint
15. Sensor surface
16. Outer turn of the upper turns
17. Surface region of the covering plate
18. Lower partial region
19. Limiting turn
20. Upper partial region
21. Lower or first partial region
22. Lower end of the pressure spring
23. Conically shaped transition region
24. Second partial region
25. Lower partial region
26. Turn of the lower partial region
A Axial distance between two turns
R Radial distance between two turns
D Spring wire diameter

I claim:

1. A capacitive proximity and/or touch-sensitive switch, comprising:
    an electrically insulating covering plate having a lower side;
    a carrier plate disposed at a spacing distance from said covering plate, said carrier plate having an electroconductive contact; and
    a pressure spring wound from an elongated body disposed between said covering plate and said carrier plate, said pressure spring being elastically deformed in a spacing direction, said pressure spring having an upper end bearing against said lower side of said covering plate and forming a sensor surface, said pressure spring having a lower end connected to said electroconductive contact of said carrier plate; and
    said pressure spring having:
        a first, substantially cylindrical partial region with a first diameter;
        a second, substantially cylindrical partial region with a second diameter different from said first diameter; and
        a substantially conical transition region between said first and second partial regions; and
    wherein said first and second partial regions are configured to be telescoped one inside the other.

2. The switch according to claim 1, wherein said upper end of said pressure spring has at least one upper turn bearing against said lower side of said covering plate, said at least one upper turn forms said sensor surface which is in direct mechanical contact with said lower side at at least three points.

3. The switch according to claim 1, wherein said pressure spring has on at least one of said upper and lower ends at least two turns lying spirally in one plane.

4. The switch according to claim 1, wherein said pressure spring disposed between said covering plate and said carrier plate is under compressive strain, and said pressure spring has on said upper end a shape which is positively adapted to said lower side of said covering plate.

5. The switch according to claim 1, wherein an axial distance exists in said upper partial region and/or said lower partial region between at least two adjacent ones of said turns in a direction of an axial spring extension which lies within a range between zero and a cross-sectional surface dimension of said elongated body in the direction of the axial spring extension, and
    a radial distance exists in a direction of a radial spring extension, said radial distance lies within a range between one and one and a half cross-sectional surface dimension of said elongated body in the direction of the radial spring extension.

6. The switch according to claim 1, wherein:
    said pressure spring has turns; and a lower partial region, wherein an axial distance exists between at least two consecutive ones of said turns in a direction of an axial spring extension that is shorter than two cross-sectional surface dimensions of said elongated body in the direction of the axial spring extension.

7. The switch according to claim 6, wherein said lower partial region is disposed on one end of said cylindrical partial section, to which is connected a region with a smaller turn diameter, or which is itself an end section of said pressure spring.

8. The switch according to claim 1, wherein said pressure spring has a position and/or twisting protection device on said lower end.

9. The switch according to claim 8, wherein said position and/or twisting protection device is formed by at least one of a molded soldering terminal and a molded soldering pin.

10. The switch according to claim 1, wherein said pressure spring has at least one lower turn on said lower end bearing against said carrier plate, and is connected galvanically at at least three points to said electroconductive contact.

11. The switch according to claim 1, further comprising a lighting element disposed on said carrier plate inside a region defined by said sensor surface.

12. The switch according to claim 11, wherein said lighting element is disposed inside said pressure spring.

13. In a capacitive proximity and/or touch-sensitive switch containing an electrically insulating covering plate having a lower side, a carrier plate disposed at a spacing distance from the covering plate and having an electroconductive contact, and a pressure spring disposed between the covering plate and the carrier plate, the pressure spring being elastically deformed in a spacing direction, the pressure spring having an upper end bearing against the lower side of the covering plate and forming a sensor surface, the pressure spring having a lower end connected to the electroconductive contact of the carrier plate, the improvement comprising:
    said pressure spring having a first, substantially cylindrical partial region with a first diameter, a second, substantially cylindrical partial region with a second diameter different from said first diameter, and a substantially conical transition region between said first and second partial regions, and wherein said first and second diameters of said first and second partial regions are dimensioned to allow said first and second partial regions to be telescoped one inside the other.

14. A capacitive proximity and/or touch-sensitive switch, comprising:
    an electrically insulating covering plate having a lower side;
    a carrier plate disposed at a spacing distance from said covering plate, said carrier plate having an electroconductive contact; and
    a pressure spring wound from an elongated body disposed between said covering plate and said carrier plate, said pressure spring being elastically deformed in a spacing direction, said pressure spring having an upper end bearing against said lower side of said covering plate and forming a sensor surface, said pressure spring having a lower end connected to said electroconductive contact of said carrier plate; and said pressure spring having an upper end formed with at least one complete upper turn bearing against said lower side of said covering plate, said at least one upper turn forming said sensor surface in direct mechanical contact with said lower side at at least three points.

15. The switch according to claim 14, wherein said upper end of said pressure spring is formed with a plurality of turns lying spirally within one another and lying on said lower side of said covering plate.

16. The switch according to claim 14, wherein said upper end of said pressure spring is formed such that, when said pressure spring is compressed, a plurality of spiral turns come to lie on and in contact with said lower side of said covering plate.

* * * * *